US008897066B2

(12) United States Patent
Jung

(10) Patent No.: US 8,897,066 B2
(45) Date of Patent: *Nov. 25, 2014

(54) METHOD OF PROGRAMMING NONVOLATILE MEMORY DEVICE

(75) Inventor: Min Joong Jung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 321 days.

This patent is subject to a terminal disclaimer.

(21) Appl. No.: 13/340,391

(22) Filed: Dec. 29, 2011

(65) Prior Publication Data

US 2012/0099373 A1 Apr. 26, 2012

Related U.S. Application Data

(63) Continuation of application No. 12/695,525, filed on Jan. 28, 2010, now Pat. No. 8,107,287.

(30) Foreign Application Priority Data

Feb. 4, 2009 (KR) ........................ 10-2009-0008801

(51) Int. Cl.
*G11C 16/06* (2006.01)
*G11C 16/10* (2006.01)
*G11C 16/04* (2006.01)
*G11C 11/56* (2006.01)
*G11C 16/34* (2006.01)

(52) U.S. Cl.
CPC ........ *G11C 11/5628* (2013.01); *G11C 16/0483* (2013.01); *G11C 16/3418* (2013.01)
USPC ............ 365/185.03; 365/185.02; 365/185.11; 365/185.12; 365/185.17; 365/185.24

(58) Field of Classification Search
CPC ........... G11C 11/5628; G11C 16/0483; G11C 16/06; G11C 16/10; G11C 16/3418; G11C 16/3427; G11C 2211/5641
USPC ............. 365/185.02, 185.03, 185.11, 185.12, 365/185.17, 185.24, 185.28
See application file for complete search history.

(56) References Cited

U.S. PATENT DOCUMENTS

| | | | | |
|---|---|---|---|---|
| 6,297,988 B1 * | 10/2001 | Parker et al. | ............. | 365/185.03 |
| 8,107,287 B2 * | 1/2012 | Jung | ........................ | 365/185.03 |
| 2004/0257846 A1 * | 12/2004 | Lee et al. | ......................... | 365/30 |
| 2006/0004952 A1 * | 1/2006 | Lasser | ........................... | 711/103 |
| 2008/0074928 A1 * | 3/2008 | Choi | ........................ | 365/185.17 |
| 2008/0094893 A1 * | 4/2008 | Choi | ........................ | 365/185.03 |
| 2008/0112238 A1 * | 5/2008 | Kim et al. | ..................... | 365/200 |
| 2008/0177934 A1 * | 7/2008 | Yu et al. | ........................ | 711/103 |
| 2008/0181015 A1 * | 7/2008 | Lee | ........................... | 365/185.22 |

* cited by examiner

*Primary Examiner* — John H. Hur
(74) *Attorney, Agent, or Firm* — IP & T Group LLP

(57) ABSTRACT

A method of programming a nonvolatile memory device includes sequentially programming first to $(n-1)^{th}$ logical pages of all the physical pages of a first memory block of the memory blocks in response to a first program command, a step of loading data of the first to $(n-1)^{th}$ logical pages stored in a first physical page of the first memory block and latching the loaded data in first to $(n-1)^{th}$ latches of each of the page buffers, respectively, when receiving a second program command after programming all the first to $(n-1)^{th}$ logical pages, and latching new program data, received along with the second program command, in an $n^{th}$ latch of the corresponding page buffer and programming the data, stored in the first to $n^{th}$ latches of the page buffer, into a first physical page of a second memory block of the memory blocks.

18 Claims, 7 Drawing Sheets

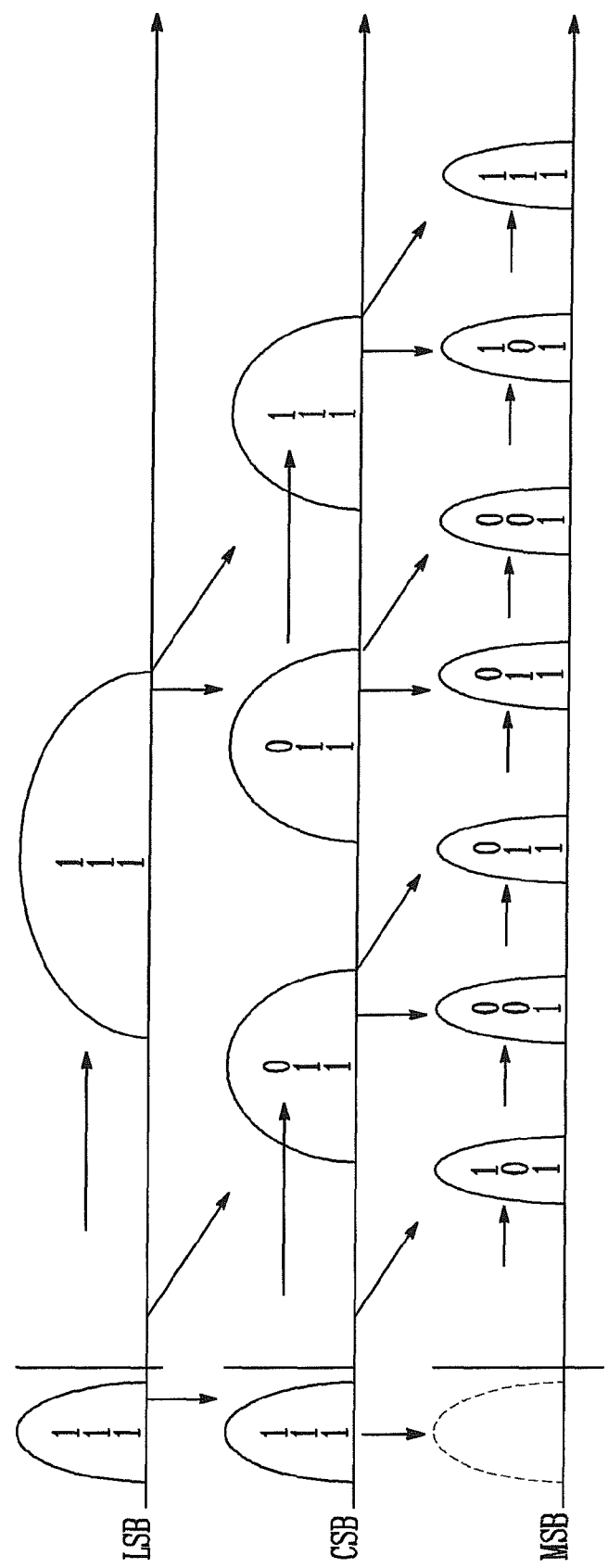

FIG. 4A

| BK<0> | | BK<1> | | BK<2> | | BK<3> | |
|---|---|---|---|---|---|---|---|
| WL<31> | 64 | WL<31> | 128 | WL<31> | 292 | WL<31> | |
| | 63 | | 127 | | 291 | | |
| | | | | | | | |
| ... | | ... | | ... | | ... | |
| | | | | | | | |
| | | | | | | | 265 |
| WL<2> | 6 | WL<2> | 70 | WL<2> | 134 | WL<2> | 6 |
| | 5 | | 69 | | 133 | | 5 |
| | | | | | | | 264 |
| WL<1> | 4 | WL<1> | 68 | WL<1> | 132 | WL<1> | 4 |
| | 3 | | 67 | | 131 | | 3 |
| | | | | | | | 263 |
| WL<0> | 2 | WL<0> | 66 | WL<0> | 130 | WL<0> | 2 |
| | 1 | | 65 | | 129 | | 1 |

FIG. 4B

| BK<0> | | BK<1> | | BK<2> | | BK<3> | |
|---|---|---|---|---|---|---|---|
| | | | 96 | | | | |
| WL<31> | 64 | WL<31> | 64 | WL<31> | | WL<31> | |
| | 63 | | 63 | | | | |
| | | | | | | | |
| ... | | ... | | ... | | ... | |
| | | | | | | | |
| | | | 67 | | | | |
| WL<2> | 6 | WL<2> | 6 | WL<2> | | WL<2> | |
| | 5 | | 5 | | | | |
| | | | 66 | | | | |
| WL<1> | 4 | WL<1> | 4 | WL<1> | | WL<1> | |
| | 3 | | 3 | | | | |
| | | | 65 | | | | |
| WL<0> | 2 | WL<0> | 2 | WL<0> | | WL<0> | |
| | 1 | | 1 | | | | |

METHOD OF PROGRAMMING NONVOLATILE MEMORY DEVICE

CROSS-REFERENCE TO RELATED APPLICATION

This application is a continuation of U.S. patent application Ser. No. 12/695,525 filed on Jan. 28, 2010, now U.S. Pat. No. 8,107,287 which claims priority of Korean patent application number 10-2009-0008801 filed on Feb. 4, 2009. The disclosure of each of the foregoing applications is incorporated herein by reference in its entirety.

BACKGROUND

One or more embodiments relate to a method of programming a nonvolatile memory device and, more particularly, to a method of programming a nonvolatile memory device, which is capable of storing 3-bit information.

A nonvolatile memory device has the advantages of random access memory (RAM), which enables the writing and erasure of data, and read only memory (ROM), which retains data even without the supply of power, and so has recently been widely used for the storage media of portable electronic devices, such as digital cameras, personal digital assistants (PDAs), and MP3 players.

The nonvolatile memory device includes a memory cell array, a row decoder, a page buffer unit, etc. The memory cell array includes a plurality of word lines elongated in rows, a plurality of bit lines elongated in columns, and a plurality of cell strings corresponding to the respective bit lines.

Memory cells have varying threshold voltages according to their program states. It is ideal that the memory cells have the same threshold voltage according to the state of data to be stored. However, in the case in which a program operation is actually performed on the memory cells, the threshold voltages of the memory cells have a different probability distribution in each region because of various external environments, such as the device characteristics and the coupling effect.

To increase the amount of data to be stored, a multi-level cell (MLC) capable of storing data of 2 bits or more in one memory cell was developed.

To store data of 2 bits or more in a memory cell, the number of threshold voltage distributions of the MLC is many and the time that it takes to perform a program operation in the MLC is long, as compared with a single level cell (SLC) capable of storing only one bit information.

Unlike in the SLC in which a program operation is performed using one word line as one page, in the MLC, a program operation is performed using many logical pages on the assumption that the MLC has the number of logical pages equal to the number of bits that can be stored in relation to one word line.

For example, an MLC capable of storing 2-bit information logically includes a least significant bit (SLC) page and a most significant bit (MSB) page in relation to one word line (i.e., a physical page). An MLC capable of storing 3-bit information logically includes an LSB page, a center significant bit (CSB) page, and an MSB page in relation to one word line.

Accordingly, while the logical pages are programmed, neighboring memory cells are continuously subject to interference, which leads to a failure in an ideal threshold voltage distribution.

BRIEF SUMMARY

One or more embodiments relate to a method of programming a nonvolatile memory device, which is capable of minimizing the effect of interference on neighboring cells while program operations are performed in a nonvolatile memory device having MLCs.

A method of programming a nonvolatile memory device according to an embodiment of this disclosure includes a step of providing a number of memory blocks each configured to comprise a number of physical pages, each of which has an n number of logical pages, where n is a positive integer, and providing a number of page buffers commonly coupled to the memory blocks, a first program step of sequentially programming first to $(n-1)^{th}$ logical pages of all the physical pages of a first memory block of the memory blocks in response to a first program command, a step of loading data of the first to $(n-1)^{th}$ logical pages stored in a first physical page of the first memory block and latching the loaded data in first to $(n-1)^{th}$ latches of each of the page buffers, respectively, when receiving a second program command after programming all the first to $(n-1)^{th}$ logical pages, and a second program step of latching new program data, received along with the second program command, in an $n^{th}$ latch of the corresponding page buffer and programming the data, stored in the first to $n^{th}$ latches of the page buffer, into a first physical page of a second memory block of the memory blocks.

The method further includes a step of resetting all the latches of the page buffer, loading data of first to $(n-1)^{th}$ logical pages of a second physical page of the first memory block, and latching the loaded data in the first to $(n-1)^{th}$ latches of the page buffer, respectively, when receiving a third program command after completing the second program step, and a third program step of latching new program data, received along with the third program command, in the $n^{th}$ latch of the page buffer and programming the data, stored in the first to $n^{th}$ latches of the page buffer, into a second physical page of the second memory block.

The method further includes the step of erasing the first memory block, after data of first to $(n-1)^{th}$ logical pages, stored in all the physical pages of the first memory block, are programmed into the second memory block.

The method further comprises the steps of selecting the first memory block or a third memory block of the number of the memory blocks and programming first to $(n-1)^{th}$ logical pages of all physical pages of the first memory block or the third memory block, after erasing the first memory block, and loading data stored in the first memory block or the third memory block and programming the loaded data, together with new program data, into a fourth memory block of the number of the memory blocks.

A method of programming a nonvolatile memory device includes a step of providing an N number of memory blocks, where N is a positive integer, each configured to comprise physical pages each including an m number of logical pages, where m is a positive integer, and providing a number of page buffers commonly coupled to the N number of the memory blocks, a first program step of sequentially programming, on a page basis, first to $(m-1)^{th}$ logical pages in each of all the physical pages of first to $(N-1)^{th}$ memory blocks in response to a first program command, a step of selecting one of the first to $(N-1)^{th}$ memory blocks in response to a second program command to obtain a selected memory block, loading data of the first to $(m-1)^{th}$ logical pages stored in a first physical page of the selected memory block, and latching the loaded data in first to $(m-1)^{th}$ latches of each of the page buffers, and a second program step of latching new program data, received along with the second program command, in an $m^{th}$ latch of the corresponding page buffer and programming the data, stored in the first to $m^{th}$ latches of the page buffer, into a first physical page of the $N^{th}$ memory block.

The method further includes a step of resetting all the latches of the page buffer, loading data of first to $(m-1)^{th}$ logical pages of a second physical page of the selected memory block, and latching the loaded data in the first to $(m-1)^{th}$ latches of the page buffer, respectively, when receiving a third program command after completing the second program step, and a third program step of latching new program data, received along with the third program command, in the $m^{th}$ latch of the page buffer and programming the data, stored in the first to $m^{th}$ latches of the page buffer, into a second physical page of the second memory block.

The first to $(N-1)^{th}$ memory blocks are sequentially selected in response to a block address.

The method further includes the step of erasing the first memory block, after programming data of first to $(m-1)^{th}$ logical pages stored in all word lines of the selected memory block into the $N^{th}$ memory block.

The method further comprises the step of loading data stored in the selected memory block and memory blocks other than the $N^{th}$ memory block, and storing the loaded data, together with new program data, in the selected memory block, when receiving a fourth program command after erasing the selected memory block.

BRIEF DESCRIPTION OF THE DRAWINGS

FIG. 2 is a diagram showing distributions of the threshold voltages according to a program operation in a known 3-bit MLC;

FIGS. 4A and 4B are diagrams illustrating the sequence of data programmed into memory blocks according to different embodiments of this disclosure.

DESCRIPTION OF EMBODIMENTS

Hereinafter, some embodiments of the present disclosure will be described in detail with reference to the accompanying drawings. The figures are provided to allow those having ordinary skill in the art to understand the scope of the embodiments of the disclosure.

Figure 1A:
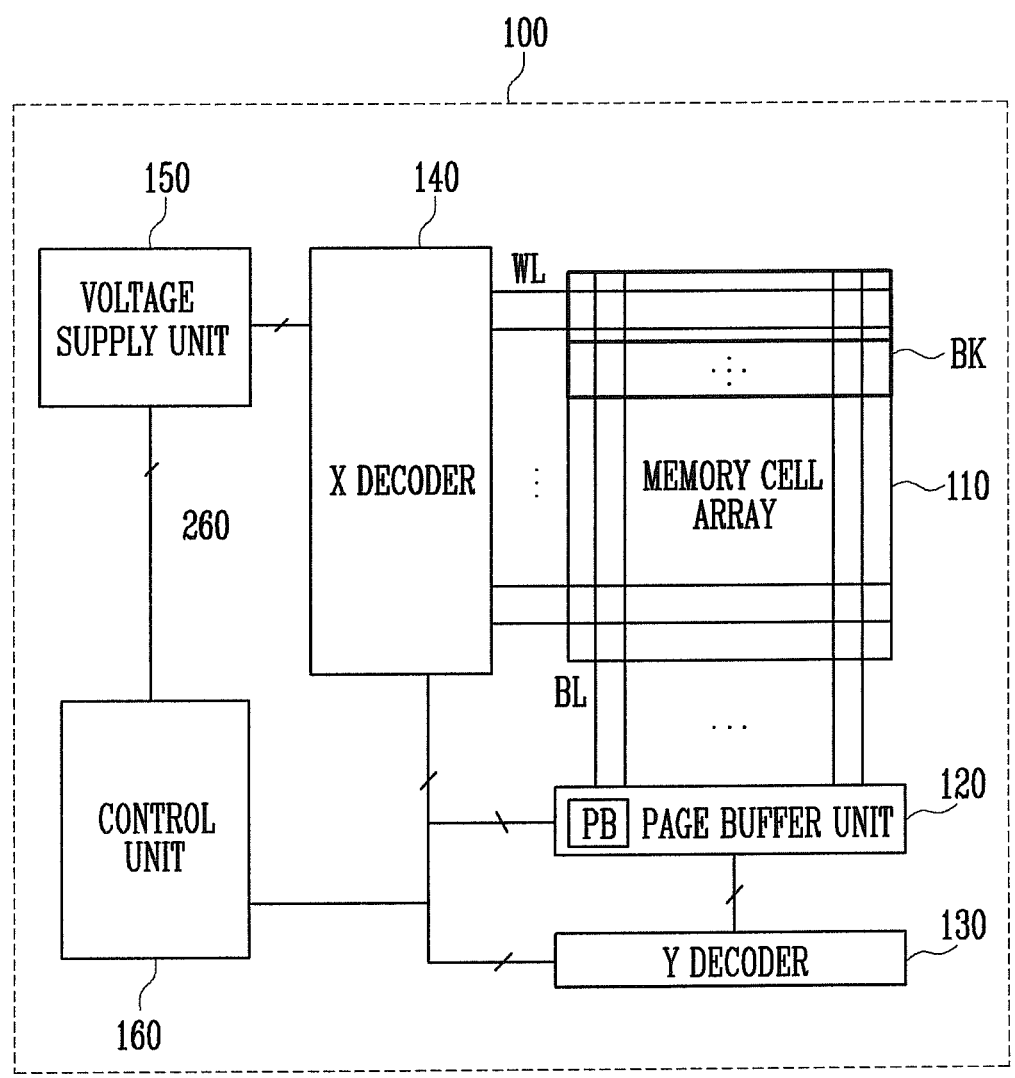
FIG. 1A is a diagram showing a nonvolatile memory device according to an embodiment of this disclosure.

FIG. 1A is a diagram showing a nonvolatile memory device according to an embodiment of this disclosure.

Referring to FIG. 1A, the nonvolatile memory device 100 according to the embodiment of this disclosure includes a memory cell array 110, a page buffer unit 120, a Y decoder 130, an X decoder 140, a voltage supply unit 150, and a control unit 160.

The memory cell array 110 includes a number of memory blocks BK. The memory blocks each include memory cells each capable of storing 3-bit information. Furthermore, the memory cells are coupled together by word lines WL and bit lines BL.

The page buffer unit 120 includes a number of page buffers PB. Each of the page buffers PB are coupled to one or more bit lines and are configured to store data to be stored in selected memory cells or to read data stored in selected memory cells and store the read data.

The Y decoder 130 is configured to provide a data IO path to the page buffers PB in response to a control signal. The X decoder 140 is configured to enable a memory block and to couple the word lines of an enabled memory block with a global word line for supplying operating voltages.

The voltage supply unit 150 is configured to generate a high voltage for a program, read, or erase operation. The control unit 160 is configured to control the operations of the nonvolatile memory device 100.

In particular, the control unit 160 controls an operation for selecting an address of a page in which input data will be programmed according to a program command, and an operation for reading data stored in an LSB page and a CSB page and programming LSB, CSB, and MSB data into another word line at the same time.

Figure 1B:
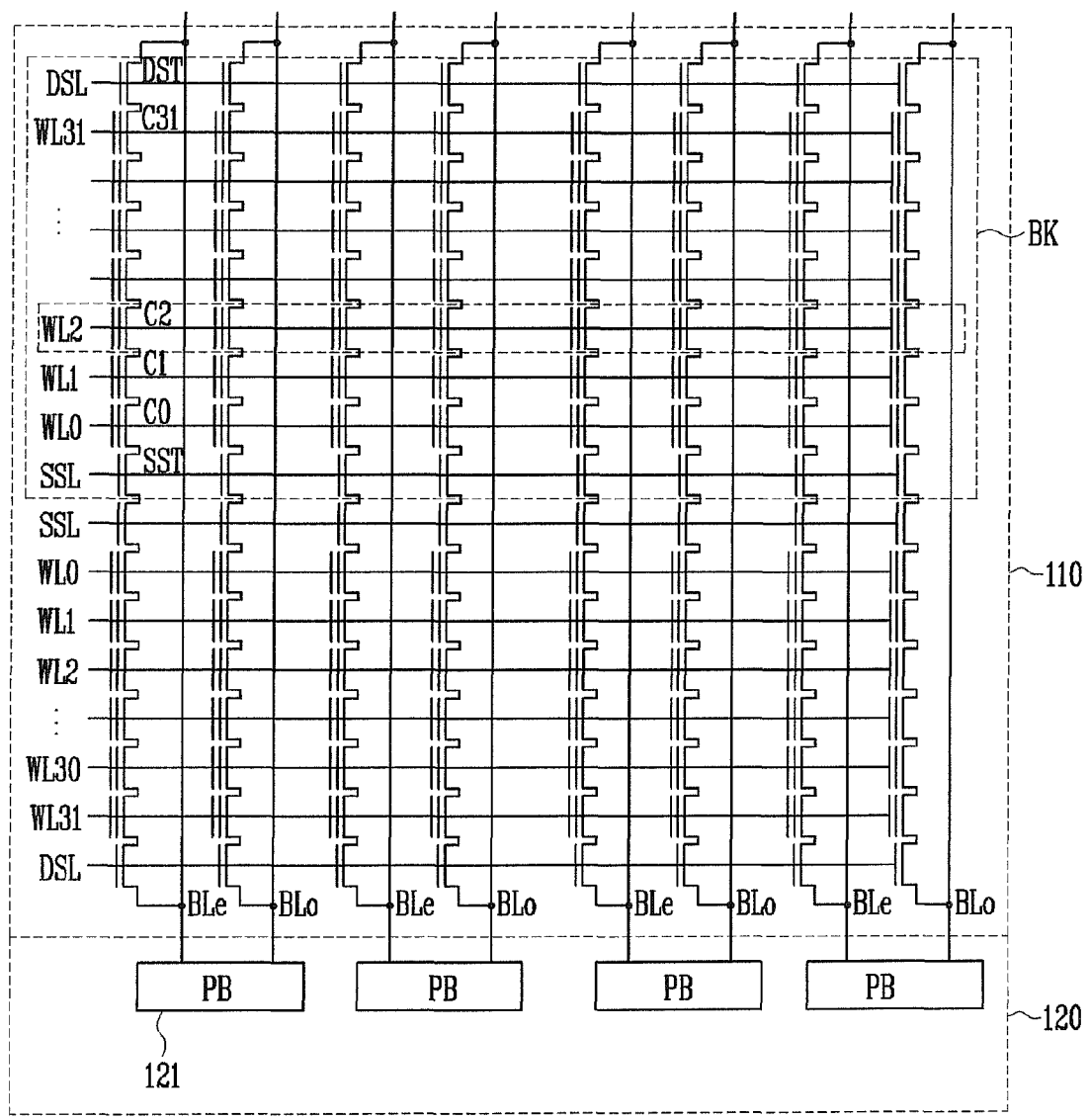
FIG. 1B is a diagram showing an embodiment of the page buffer unit of the nonvolatile memory device shown in FIG. 1A.

FIG. 1B is a diagram showing an embodiment of a page buffer unit of the nonvolatile memory device shown in FIG. 1A.

Referring to FIG. 1B, the memory blocks BK of the memory cell array 110 include cell strings coupled to the respective bit lines.

One cell string includes $0^{th}$ to thirty-first memory cells C0 to C31 coupled in series between a drain select transistor DST and a source select transistor SST.

The drains of the drain select transistors are coupled to the respective bit lines, and the sources of the source select transistors are coupled to a common source line CSL.

The gates of the drain select transistors are coupled to a drain selection line DSL, and the gates of the source select transistors are coupled to a source selection line SSL. The gates of the $0^{th}$ to thirty-first memory cells C0 to C31 are respectively coupled to $0^{th}$ to thirty-first word lines WL0 to WL31.

The $0^{th}$ to thirty-first memory cells C0 to C31 are MLCs each capable of storing 3-bit information. Accordingly, one word line includes logical pages, including LSB pages, CSB pages, and MSB pages.

In the embodiment of this disclosure, a pair of an even bit line BLe and an odd bit line BLo is coupled to one page buffer PB. Here, the page buffer PB includes a number of latch circuits for storing data. In an embodiment of this disclosure, the nonvolatile memory device includes MLCs each capable of storing 3-bit information, and so three or more latch circuits have to be included in each page buffer PB.

FIG. 2 is a diagram showing distributions of the threshold voltages according to a program operation in a known 3-bit MLC.

Referring to FIG. 2, in a nonvolatile memory device including MLCs each capable of storing 3-bit information, a program operation for three logical pages is performed on one word line.

That is, as shown in FIG. 2, in the state in which all memory cells are in an erase state, an LSB page program is performed on memory cells belonging to one threshold voltage distribution, and so the threshold voltage distribution is divided into two distributions.

In the state in which the LSB page program has been performed, when a CSB page program is performed, the two threshold voltage distributions each are divided into two more threshold voltage distributions, resulting in a total of four threshold voltage distributions. Next, when an MSB page program is performed, each of the four threshold voltage distributions are also divided into two more threshold voltage distributions, resulting in a total of eight threshold voltage distributions.

Here, while the three logical page programs, including the LSB, CSB, and MSB pages, are performed, memory cells neighboring selected memory cells are continuously influenced by the program operations, and the selected memory cells are also influenced by each other.

To prevent interference among neighboring memory cells during the three local page programs, a method of latching data to be stored in the LSB, CSB, and MSB pages in the page buffer PB at a time and performing the LSB, CSB, and MSB page programs at the same time can be used. However, performing the three logical page programs at the same time can have an effect on neighboring memory cells.

Accordingly, in an embodiment of this disclosure, in the case of an MLC capable of storing 3-bit information, only up to two logical pages for all the word lines of a memory block can be programmed at the same time, in order to reduce such interference. In the case in which the MSB page has to be programmed, a method of reading data already stored in the LSB and CSB pages, combining the read data and data to be programmed into the MSB page, and programming the combined data into another memory block can be used.

Figure 3A:
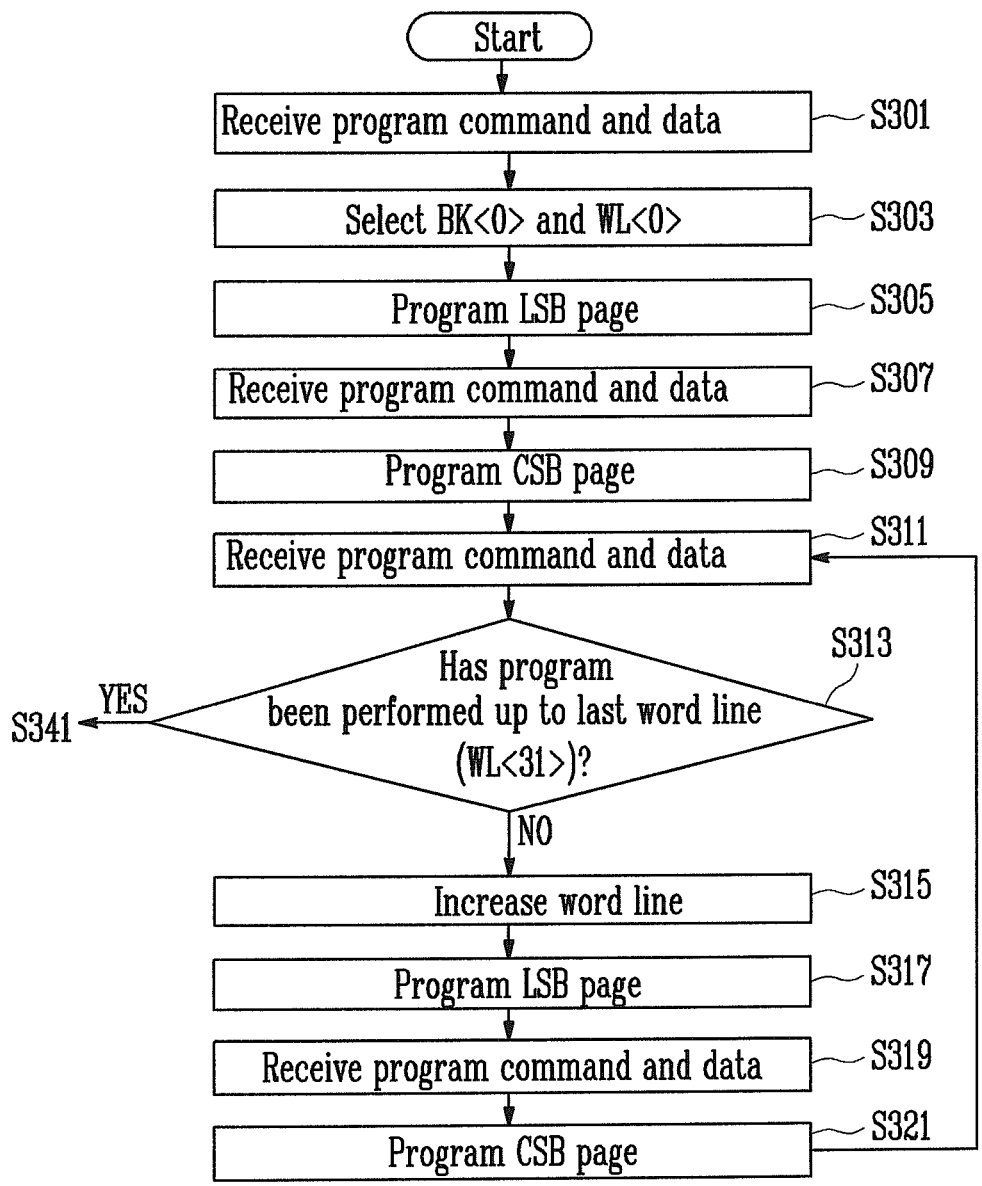
FIG. 3A is a flowchart illustrating a portion of a program operation according to a first embodiment of this disclosure.

FIG. 3A is a flowchart illustrating a portion of a program operation according to a first embodiment of this disclosure.

To describe FIG. 3A, reference will be made to FIGS. 1A and 1B, and it is assumed that all the memory cells of the memory cell array 110 are in an erase state.

Referring to FIG. 3A, when a program command and program data are inputted at step S301, the control unit 160 selects the $0^{th}$ word line WL<0> of the $0^{th}$ memory block BK<0> at step S303 and programs the program data into an LSB page at step S305. Next, when a program command and program data are inputted at step S307, the control unit 160 selects the $0^{th}$ word line WL<0> of the $0^{th}$ memory block BK<0> and programs the program data into a CSB page at step S309.

Next, when a program command and program data are inputted at step S311, the control unit 160 determines whether there exists, in the $0^{th}$ memory block BK<0>, a word line that will be programmed at step S313. In other words, the control unit 160 determines whether the LSB and CSB page programs have been performed up to the thirty-first word line WL<31> (i.e., the last word line).

If, as a result of the determination, the LSB and CSB page programs are determined not to have been performed up to the thirty-first word line WL<31>, the control unit 160 increases an address of a word line to be selected (i.e., selects the next word line by, for example, increasing the address/number 30 to the address/number 31 in order to go from selecting the thirtieth word line WL<30> to selecting the thirty-first word line WL<31>) and performs only the LSB and CSB page programs according to a program command and program data at steps S315 to S321.

To this end, when selecting addresses to indicate word lines to be programmed in response to the program command, the control unit 160 performs only the LSB and CSB page programs on all the word lines of the $0^{th}$ memory block BK<0>.

After the LSB and CSB page programs are all performed on the $0^{th}$ to thirty-first word lines WL<0> to WL<31> of the $0^{th}$ memory block BK<0>, the process turns to step S341. In other words, if at step S313 it is determined that the LSB and CSB page programs have been performed up to the last word line (e.g., WL<31>), then the process continues to step S341. The control unit 160 then performs a subsequent process, such as that shown in FIG. 3B.

Figure 3B:
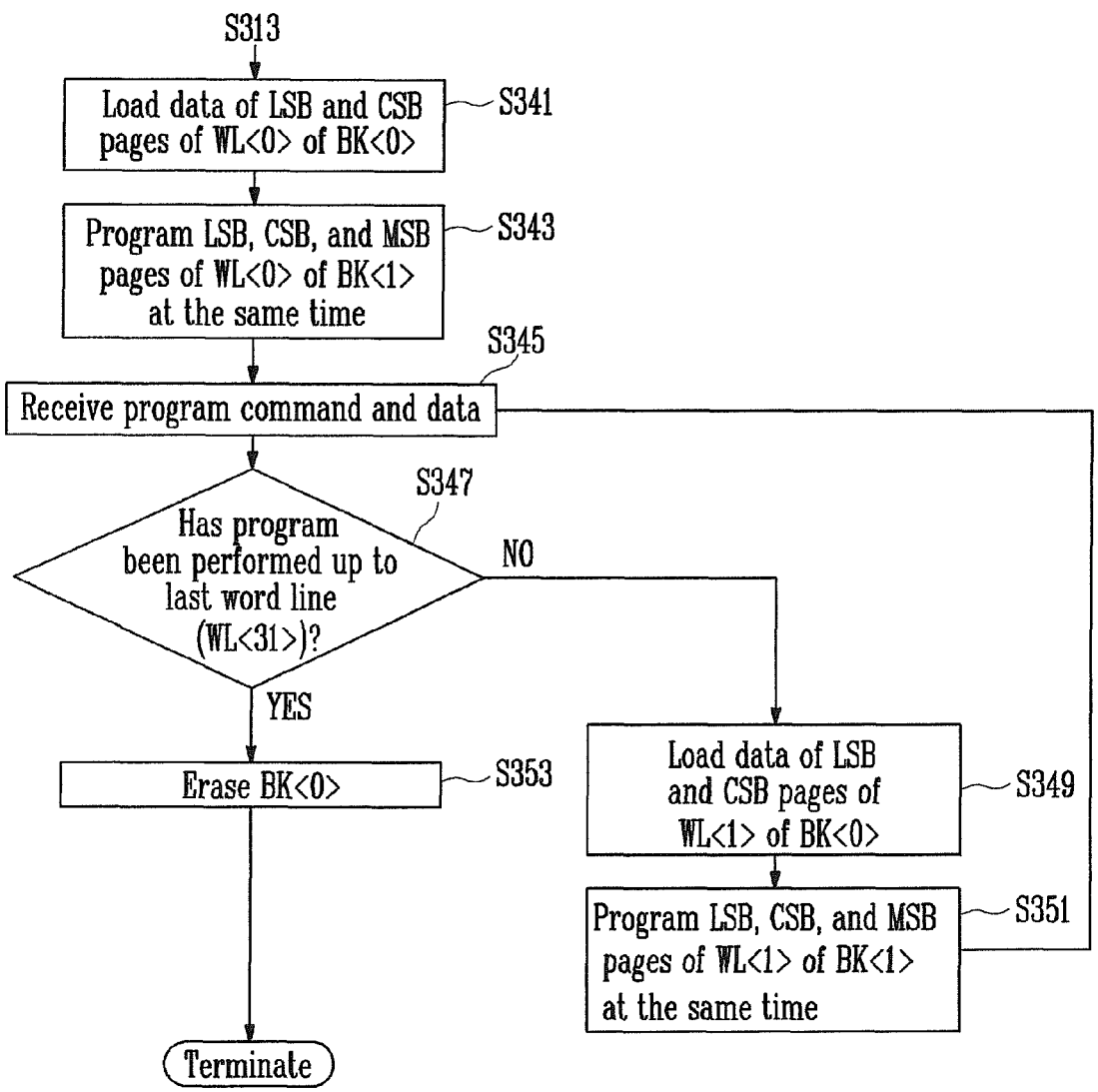
FIG. 3B is a flowchart illustrating another portion of the program operation according to the first embodiment of this disclosure.

FIG. 3B is a flowchart illustrating another portion of the program operation according to the first embodiment of this disclosure, which is performed subsequently to the portion of the program operation of FIG. 3A.

Referring to FIG. 3B, if, as a result of the determination at step S313, the LSB and CSB page programs are determined to have been performed up to the thirty-first word line WL<31> (i.e., up to the last word line), the control unit 160 loads the data of the LSB and CSB pages, stored in the $0^{th}$ word line WL<0> of the $0^{th}$ memory block BK<0>, and stores the loaded data in the two latch circuits of the page buffer PB at step S341. Here, program commands and program data are stored in one of the latch circuits of the page buffer PB other than the two latch circuits. To this end, as described above, the page buffer PB has to include three or more latch circuits, and LSB, CSB, and MSB data are stored in the respective latch circuits.

In the state in which, as described above, the three bit data are all stored in the page buffer PB, at step S343 the control unit 160 programs the three bit data into the $0^{th}$ word line WL<0> of the first memory block BK<1> at the same time. Accordingly, the threshold voltages of memory cells coupled to the $0^{th}$ word line WL<0> of the first memory block BK<1> are classified into eight threshold voltage distributions.

Next, when a program command and program data are inputted at step S345, the LSB and CSB data stored in the $0^{th}$ word line WL<0> to the thirty-first word line WL<31> of the $0^{th}$ memory block BK<0> are moved to the word lines of the first memory block BK<1>. At step S347, it is determined whether the program has been performed for each of the word lines of the first memory block BK<1>, such that each memory cell has three bits. If, at step S347, it is determined that not all of the word lines of the first memory block BK<1> have been programmed, then the process proceeds to step S349. At step S349 the control unit 160 loads the data of the LSB and CSB pages, stored in the next word line of the $0^{th}$ memory block (e.g. the first word line WL<1>). After step S349, the process proceeds to step S351 where the control unit 160 programs the three bit data into the next word line (e.g., the first word line WL<1>) of the first memory block BK<1>. The above processes S345 to S351 are then repeatedly performed until all of the word lines (e.g., the $0^{th}$ word line WL<0> to the thirty-first word line WL<31>) of the first memory block BK<1> are programmed with the three bit data.

After the LSB and CSB data stored in the thirty-first word line WL<31> of the $0^{th}$ memory block BK<0> are loaded and then programmed into the thirty-first word line WL<31> of the first memory block BK<1> along with MSB data, the $0^{th}$ memory block BK<0> is erased, such that it can be used for other programs. In other words, after it has been determined at step S347 that the program has been performed up to the last word line, the process proceeds to step S353 where the $0^{th}$ memory block BK<0> is erased.

As three bits are programmed at a time, as described above, interference on neighboring cells can be reduced, and the memory cell array 110 can be programmed like a 2-bit MLC having only LSB and CSB pages. If data of 3 bits or more are to be programmed, a method of programming the data of 3 bits at a time is used.

FIGS. 4A and 4B are diagrams illustrating the sequence of data programmed into memory blocks according to different embodiments of this disclosure.

In FIGS. 4A and 4B, it is assumed that the memory cell array 110 includes only $0^{th}$ to third memory blocks BK<0> to BK<3> and the sequence is assigned to program data.

Referring to FIG. 4A, the LSB and CSB page programs have been performed for the first and second memory blocks BK<1> and BK<2>. In the case in which further program data exist, the data stored in the LSB and CSB pages of the $0^{th}$ memory block BK<0> can be loaded and then stored in the third memory block BK<3>. As shown in FIG. 4A, the MSB pages of the $0^{th}$ to second memory blocks BK<0> to BK<2> are empty. Accordingly, the data stored in the $0^{th}$ memory block BK<0> are loaded and then stored in the third memory block BK<3> along with the further program data.

When the third memory block BK<3> is fully programmed, the $0^{th}$ memory block BK<0> is erased, and data stored in the first memory block BK<1> are loaded and then stored in the $0^{th}$ memory block BK<0>.

An alternative method is described below with reference to FIG. 4B.

That is, as described above with reference to FIGS. 3A and 3B, when LSB and CSB page programs are performed on all the word lines of the $0^{th}$ memory block BK<0>, data stored in the LSB and CSB pages of the $0^{th}$ memory block BK<0> are loaded and, together with MSB data, and programmed into the first memory block BK<1> in response to a subsequent program command. The $0^{th}$ memory block BK<0> is then erased.

Next, when program data are inputted, the program data are programmed into only the LSB and CSB pages of the $0^{th}$ memory block BK<0> or any one of the second to third memory blocks BK<2> to BK<3>. Next, the data stored in the LSB and CSB pages of the corresponding memory block are moved to another memory block.

In this case, an operation for arbitrarily selecting a memory block in which two pages are programmed, programming data into the LSB and CSB pages of the corresponding memory block, and moving the data of the LSB and CSB pages to another memory block may be repeatedly performed. However, if only a specific memory block is used, program/erase cycles for the specific memory block are increased, and so the specific memory block can be deteriorated. To avoid this problem, an arbitrary memory block can be properly selected and programmed.

According to the above program method, data of 3 bits or more can be stored in the memory cell array 110, including memory cells each capable of storing 3 bits, while programming the memory cell array 110 like a 2-bit MLC to a maximum.

Accordingly, the memory cell array according to the present disclosure has the same memory capacity as one for storing 3-bit information, but operates like a 2-bit MLC. Consequently, an interference phenomenon can be reduced, and reliability of data can be improved.

Further, in the program method of this disclosure, in the state in which CSB data are not stored, only LSB data stored in memory cells can be loaded and programmed along with MSB data. In this case, the CSB data can be masked as dummy data.

As described above, in accordance with the method of programming a nonvolatile memory device according to the present disclosure, when an MLC capable of storing N bits (where N is a positive integer) is programmed, up to only N−1 bits are first programmed into all the word lines of a memory block. Accordingly, an interference phenomenon can be reduced. Furthermore, before an $N^{th}$ bit is programmed, 1 to N−1 bit data are previously loaded, and the N bits are programmed into the word lines of another memory block at the same time. Accordingly, an interference phenomenon can be minimized.

What is claimed is:

1. A programming method of a non-volatile memory device, comprising:
    storing LSB data and CSB data in an LSB page and a CSB page of word lines included in a first memory block of the non-volatile memory device;
    receiving a program command and MSB data; and
    storing the LSB data read from the LSB page included in the first memory block of the non-volatile memory device, the CSB data read from the CSB page included in the first memory block of the non-volatile memory device, and the MSB data in a second memory block of the non-volatile memory device.

2. The programming method of claim 1, wherein first LSB data and first CSB data are stored in a first LSB page and a first CSB page of a word line selected from the first memory block and second LSB data and second CSB data are then stored in a second LSB page and a second CSB page of a next word line.

3. The programming method of claim 1, wherein the LSB data, the CSB data, and the MSB data are received along with different program commands.

4. The programming method of claim 1, further comprising reading the LSB data and the CSB data stored in the LSB page and the CSB page of the first memory block, after receiving the MSB data.

5. The programming method of claim 1, wherein the LSB data, the CSB data, and the MSB data are simultaneously stored in an LSB page, a CSB page, and an MSB page of word lines included in the second memory block.

6. The programming method of claim 1, further comprising erasing the LSB data and the CSB data stored in the first memory block, after storing the LSB data, the CSB data, and the MSB data in the second memory block.

7. A programming method of a non-volatile memory device, comprising:
    storing data in first to $(n-1)^{th}$ logical pages of n logical pages of word lines included in a first memory block of the non-volatile memory device;
    receiving a program command and MSB data; and
    storing the data read from the first to $(n-1)^{th}$ logical pages included in the first memory block of the non-volatile memory device and the MSB data in n logical pages of word lines included in a second memory block of the non-volatile memory device.

8. The programming method of claim 7, wherein first data is stored in first to $(n-1)^{th}$ logical pages of a word line selected from the first memory block and second data is then stored in first to $(n-1)^{th}$ logical pages of a next word line.

9. The programming method of claim 7, wherein the data stored in the first to $(n-1)^{th}$ logical pages and the MSB data are received along with different program commands.

10. The programming method of claim 7, further comprising reading the data stored in the first to $(n-1)^{th}$ logical pages of the first memory block, after receiving the MSB data.

11. The programming method of claim 7, wherein the data read from the first to $(n-1)^{th}$ logical pages and the MSB data are simultaneously stored in the n logical pages of the word lines included in the second memory block.

12. The programming method of claim 7, further comprising erasing the data stored in the first memory block, after storing the data read from the first to $(n-1)^{th}$ logical pages and the MSB data in the second memory block.

13. A non-volatile memory device, comprising:
    a memory cell array configured to include a first memory block and a second memory block; and
    circuits configured to store data in first to $(n-1)^{th}$ logical pages of n logical pages of word lines included in the first memory block and store MSB data, received along with a program command, in the second memory block along with the data read from the first to $(n-1)^{th}$ logical pages.

14. The non-volatile memory device of claim 13, wherein the circuits are configured to store first data first to $(n-1)^{th}$ logical pages of a word line selected from the first memory block and then store second data in first to $(n-1)^{th}$ logical pages of a next word line.

15. The non-volatile memory device of claim 13, wherein the circuits are configured to read the data stored in the first to $(n-1)^{th}$ logical pages of the first memory block, after receiving the MSB data.

16. The non-volatile memory device of claim 13, wherein the circuits are configured to simultaneously store the data read from the first to $(n-1)^{th}$ logical pages and the MSB data in n logical pages of word lines included in the second memory block.

17. The non-volatile memory device of claim 13, wherein the circuits are configured to erase the data stored in the first memory block, after storing the data read from the first to $(n-1)^{th}$ logical pages and the MSB data in the second memory block.

18. The non-volatile memory device of claim 13, wherein the circuits are configured to store the data read from the first to)logical pages of the first memory block in first to $(n-1)^{th}$ logical pages of word lines included in the second memory block and store the MSB data in $n^{th}$ logical pages of the word lines of the second memory block.

* * * * *